(12) United States Patent
Bakucz

(10) Patent No.: US 11,835,596 B2
(45) Date of Patent: Dec. 5, 2023

(54) MAGNETIC PARKING SENSOR

(71) Applicant: Robert Bosch GmbH, Stuttgart (DE)

(72) Inventor: Peter Bakucz, Klosterlechfeld (DE)

(73) Assignee: ROBERT BOSCH GMBH, Stuttgart (DE)

( * ) Notice: Subject to any disclaimer, the term of this patent is extended or adjusted under 35 U.S.C. 154(b) by 433 days.

(21) Appl. No.: 17/264,654

(22) PCT Filed: Oct. 15, 2019

(86) PCT No.: PCT/EP2019/077950
§ 371 (c)(1),
(2) Date: Jan. 29, 2021

(87) PCT Pub. No.: WO2020/108840
PCT Pub. Date: Jun. 4, 2020

(65) Prior Publication Data
US 2021/0333335 A1  Oct. 28, 2021

(30) Foreign Application Priority Data

Nov. 28, 2018  (DE) .......................... 102018220421.7

(51) Int. Cl.
*G01R 33/00* (2006.01)
*G01R 33/02* (2006.01)
(Continued)

(52) U.S. Cl.
CPC ..... *G01R 33/0029* (2013.01); *G01R 33/0206* (2013.01); *G01V 3/081* (2013.01); *G08G 1/141* (2013.01)

(58) Field of Classification Search
None
See application file for complete search history.

(56) References Cited

U.S. PATENT DOCUMENTS

2011/0218940 A1  9/2011  Bergstrom et al.
2018/0165961 A1  6/2018  Chang et al.

FOREIGN PATENT DOCUMENTS

DE  102015219735 A1  4/2017

OTHER PUBLICATIONS

Bunde, A., et al., "Fractals and Disordered Systems," Springer-Verlag, Berlin, Heidelberg, 1991, pp. 1-350.
(Continued)

*Primary Examiner* — Adolf Dsouza
(74) *Attorney, Agent, or Firm* — NORTON ROSE FULBRIGHT US LLP; Gerard Messina

(57) ABSTRACT

A magnetic parking sensor including a detection device for detecting geomagnetic measured values in the region of a parking space in three coordinates; a first-in, first-out memory device into which the geomagnetic measured values are loadable; and an ascertainment device. The ascertainment device is configured to map the x and y components of the geomagnetic measured values into complex numbers, the complex numbers being ascertainable depending on the variability of the defined number of the geomagnetic measured values; to define a number system having a defined number of elements in accordance with the variability of the geomagnetic measured value and of the complex numbers; and to ascertain an availability state of the parking space by ascertaining a root $\lambda_n$ of the polynomial $\lambda^3 - (2n-1)\lambda^2 - (n-1)^2\lambda - (n^2+1)$, where n=variability of the geomagnetic measured values, $\lambda$=auxiliary variable of the number theory.

9 Claims, 6 Drawing Sheets

(51) Int. Cl.
    *G08G 1/14*    (2006.01)
    *G01V 3/08*    (2006.01)

(56)            References Cited

OTHER PUBLICATIONS

International Search Report for PCT/EP2019/077950, dated Jan. 27, 2020.
Katai, I., et al., "Canonical Number Systems for Complex Integers," Acta Scientiarum Mathematicarum, Bolyai Institute, University of Szeged, vol. 37, 1975, pp. 255-260. Downloaded Jan. 26, 2021.
Katai, I., "Generalized Number Systems in Euclidean Spaces," Mathematical and Computer Modelling, vol. 38, Issues 7-9, 2003, pp. 883-892. Downloaded Jan. 26, 2021.

MAGNETIC PARKING SENSOR

FIELD

The present invention relates to a magnetic parking sensor. The present invention further relates to a method for producing a magnetic parking sensor. The present invention further relates to a method for ascertaining an availability state of a parking space. The present invention further relates to a computer program product.

BACKGROUND INFORMATION

Parking in conjunction with vehicle traffic represents a major problem, with significant effects on traffic congestion and urban landscapes. A reduction in space for parking is increasingly leading to the development of fully automated and mechanical parking systems, although such systems are also limited because of their costs for deployment and maintenance.

Magnetic signal strength analysis in an automated parking lot management (APLM) environment is a highly nonlinear problem, and can be approximated by way of adaptive structures based on reference measurements.

Katai, I.: "Generalized Number Systems in Euclidean Spaces," Math. and Comp. Mod. 38, 2003, 883; and Katai, I, Szabo, J.: "Canonical number systems for complex integers," Acta Sci. Mth. Szeged 37, 1974, describe a mathematical theory for mapping numerical values into a number space.

Bunde, A., Havlin, S., "Fractals and Disordered Systems," Springer-Verlag, Berlin, Heidelberg, 1991 describes effects of disorder on mesoscopic scalings, and describes tools for describing them in mathematical language.

SUMMARY

An object of the present invention is to provide an improved magnetic parking sensor.

According to a first aspect of the present invention, the object may be achieved with a magnetic parking sensor. In an example embodiment of the present invention, the magnetic parking sensor includes:

a detection device for detecting geomagnetic measured values in the region of a parking space in three coordinates;

a first-in, first-out memory device into which x and y components of the geomagnetic measured values are loadable, a magnetic variability being ascertainable for each of the magnetic measured values in the first-in, first-out memory device; and an ascertainment device that is configured to map the x and y components of the geomagnetic measured values as complex numbers, the complex numbers being ascertainable depending on the variability of a defined number of geomagnetic measured values; and to define a number system having a defined number of elements in accordance with the variability of the geomagnetic measured values and of the complex numbers;

to ascertain an availability state of the parking space by ascertaining a root $\lambda_n$ of the polynomial $$\lambda^3 - (2n-1)\lambda^2 - (n-1)^2\lambda - (n^2+1)$$

where n=variability of the geomagnetic measured values;

$\lambda$=auxiliary variable of the number theory ("Ito variable"), such that $2 \times \log(\lambda_n)/\log(n^2+1) > a$ indicates an occupied state of the parking space, and $2 \times \log(\lambda_n)/\log(n^2+1) < a$ indicates an unoccupied state of the parking space, where a=defined threshold value.

It thereby becomes possible to ascertain an availability state of the parking space in an easily executed manner by way of the magnetic parking sensor, since complex numbers are very easy to represent in the complex presentation. The "simplicity" lies in the fact that the two components (magnetic x and y) are taken as a complex number, and the operations (multiplication, addition, etc.) are thereby simplified. Otherwise the components would need to be taken as two-element vectors. In addition, for example, conventional microcontrollers also use a complex arithmetic, so that ascertainment can easily be performed. As a result, the method is easily implementable in a battery-operated microcontroller that has limited computation capacity and is programmed using a suitable programming language, for example Assembler, C, C++, etc. This promotes a long operating time for the magnetic parking sensor in the field even in austere operating conditions.

Advantageously, laborious computation operations such as wavelet transformations, etc. are not necessary in order to ascertain an availability state. The result is that a metric deriving from magnetic measurements is mapped into a complex number base, the first-in, first-out memory device being used to furnish the respectively most-current measured value and thus to take into account changing physical, construction-related, traffic-related, material-related, etc. influences on the geomagnetic measured value.

According to a second aspect of the present invention, the object may achieved with a method for producing a magnetic parking sensor. In an example embodiment of the present invention, the method includes:

furnishing a detection device for detecting geomagnetic measured values in the region of a parking space in three coordinates;

furnishing a first-in, first-out memory device, functionally connected to the detection device, into which x and y components of the geomagnetic measured values are loadable, a magnetic variability being ascertainable for a defined number of the x and y components of the magnetic measured values in the first-in, first-out memory device; and furnishing an ascertainment device that is functionally connected to the first-in, first-out memory device and is configured to map the geomagnetic measured values as complex numbers, the complex base number being ascertainable depending on the variability of the geomagnetic measured value; and to define a number system having a defined number of elements in accordance with the variability of the geomagnetic measured value and of the complex base number;

to ascertain an availability state of the parking space by ascertaining a root $\lambda_n$ of the polynomial $\lambda^3 - (2n-1)\lambda^2 - (n-1)^2\lambda - (n^2+1)$ such that $2 \times \log(\lambda_n)/\log(n^2+1) > a$ indicates an occupied state of the parking space, and $2 \times \log(\lambda_n)/\log(n^2+1) < a$ indicates an unoccupied state of the parking space, where
n=variability of the geomagnetic measured values;
λ=auxiliary variable;
a=defined threshold value determined offline.

According to a third aspect of the present invention, the object may achieved by way of a method for ascertaining an availability state of a parking space. In accordance with an example embodiment of the present invention, the method includes:

three-dimensionally detecting geomagnetic measured values in the region of a parking space;
loading the geomagnetic measured values into a first-in, first-out memory device;
ascertaining a magnetic variability for x and y components of a defined number of geomagnetic measured values in the first-in, first-out memory device; and
mapping the geomagnetic measured values as complex numbers, the complex numbers being ascertained depending on the variability of the geomagnetic measured value, and for defining a number system having a defined number of elements in accordance with the variability of the geomagnetic measured value and of the complex numbers; and
ascertaining an availability state of the parking space by ascertaining a root $\lambda_n$ of the polynomial $\lambda^3-(2n-1)\lambda^2-(n-1)^2\lambda-(n^2+1)$ such that $2\times\log(\lambda_n)/\log(n^2+1)>a$ indicates an occupied state of the parking space, and $2\times\log(\lambda_n)/\log(n^2+1)<a$ indicates an unoccupied state of the parking space, where
n=variability of the geomagnetic measured values;
λ=auxiliary variable;
a=defined threshold value determined offline.

Preferred refinements of the magnetic parking sensor are described herein.

An advantageous magnetic parking sensor is notable for the fact that the x and y components of the three-dimensional geomagnetic measured values are mapped into the defined complex number base 1–i. A proven complex number base that allows the availability state of the parking space to be reliably ascertained is thereby used for mapping the x and y components. A distinction between occupancy and non-occupancy of the parking place can be made particularly effectively using this number base. This has been determined by extensive experiments in offline analyses, based on extensive measurement series.

A further advantageous refinement of the magnetic parking sensor in accordance with the present invention is notable for the fact that a calculation is executable by way of the ascertainment device at defined time intervals. This advantageously supports energy-saving operation of the magnetic parking sensor, thereby enabling a long service life for the magnetic parking sensor.

A further advantageous refinement of the magnetic parking sensor in accordance with the present invention is notable for the fact that the first-in, first-out memory device is embodied for a power of two of geomagnetic measured values. The respectively most-recent geomagnetic measured value can thereby be used. Thanks to the power of two, the capacity of the first-in, first-out memory device can easily be modified in terms of programming by changing the exponent. This advantageously assists adjustability of a detection rate depending on the exponent. A detection accuracy of the magnetic parking sensor can thereby advantageously be dimensioned.

A further advantageous refinement of the magnetic parking sensor in accordance with the present invention is notable for the fact that the first-in, first-out memory device is embodied for a power of two of the geomagnetic measured values, preferably for 128 or 256 or 512 or 1024 measured values. A very high detection accuracy for the magnetic parking sensor can thereby advantageously be achieved.

The present invention is described below in detail, along with further features and advantages, with reference to several Figures. Identical or functionally identical elements have the same reference characters. The Figures illustrating main features of the present invention, and are not necessarily executed exactly to scale. In the interest of better clarity, provision can be made that not all reference characters are entered in all the Figures.

Disclosed method features are evident analogously from corresponding disclosed apparatus features, and vice versa. This means in particular that features, technical advantages, and embodiments relating to the magnetic parking sensor are evident analogously from corresponding embodiments, features, and advantages relating to the method for producing a magnetic parking sensor or relating to the method for ascertaining an availability state of a parking space, and vice versa.

DETAILED DESCRIPTION OF EXAMPLE EMBODIMENTS

Example embodiments of the present invention may provide, in particular, an inexpensive magnetic parking sensor that is based on a magnetic signal analysis.

Figure 1:
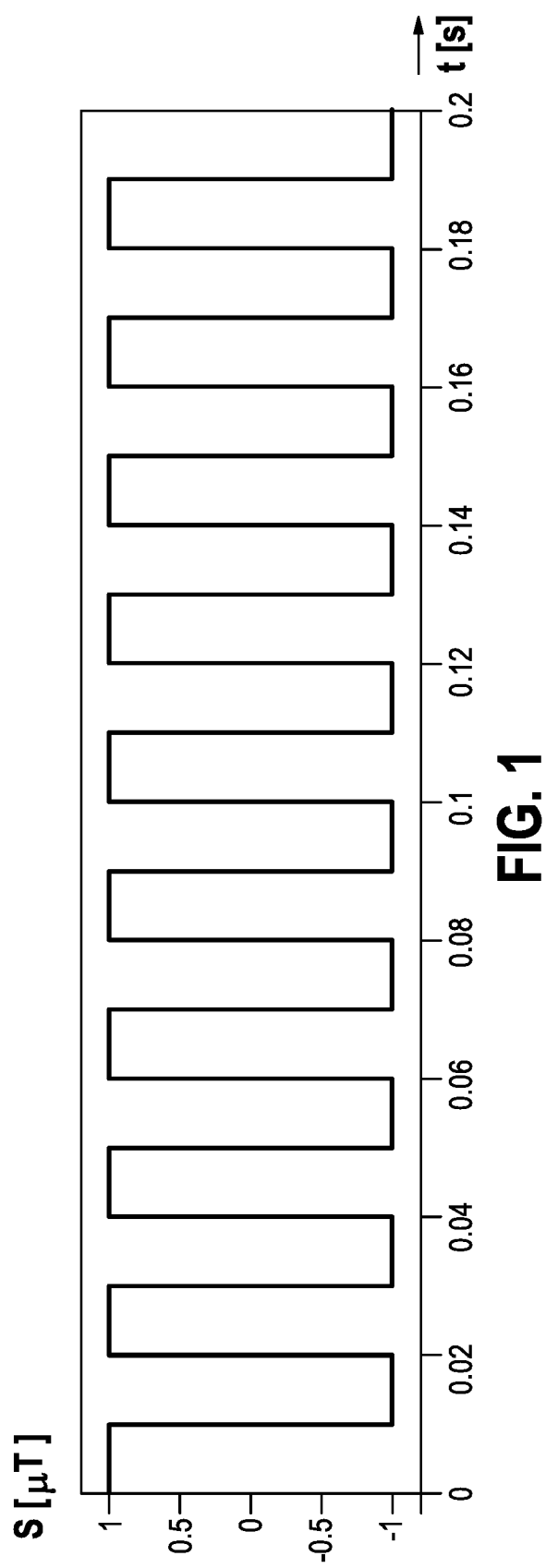
FIG. 1 shows a signal of an ideal magnetic parking sensor, in accordance with an example embodiment of the present invention.

FIG. 1 shows an idealized time profile of a signal S of a magnetic parking sensor (not depicted). It is evident that signal S is ideally square-shaped, the upper value of the square-wave signal signifying an occupied state and the lower value of the square-wave signal signifying an unoccupied state of the parking space. The aforesaid assignment can of course also be the inverse (i.e., upper value corresponds to unoccupied state, lower value corresponds to occupied state; not depicted). In this case the variability of the signal S is one.

Figure 2:
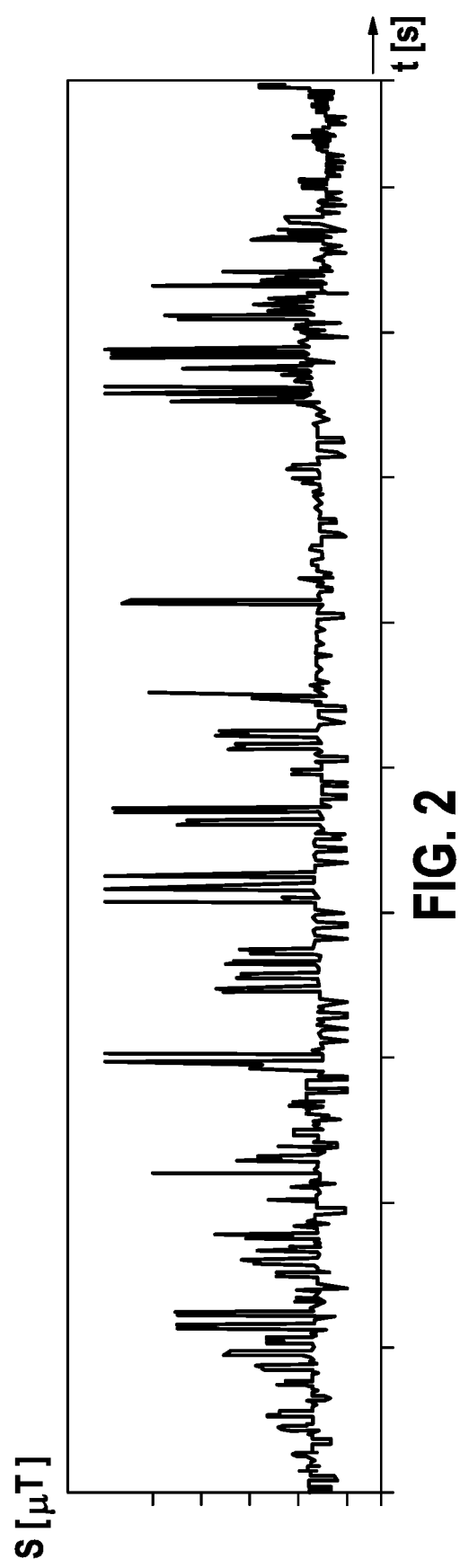
FIG. 2 shows a signal of a real magnetic parking sensor, in accordance with an example embodiment of the present invention.

FIG. 2, conversely, shows a time course of a real signal S of a magnetic parking sensor. It is evident that this signal oscillates substantially more, but has square-wave portions which are caused, e.g., by geomagnetic influences, environmental influences, weather influences, geographic influences, influences from other vehicles, etc. The result is thus that the variability V of the real signal S of the magnetic parking sensor is substantially higher, for example approximately 100 to 200. The "variability" V is understood here to be how stochastic or "chaotic" the geomagnetic signal S is. The variability V is calculated as a "distance" of the equal square-wave function (amplitude and phase are identical) by way of Haar wavelets (square basis). This means that the value 100 represents the degree of deviation of the Haar wavelets (square-wave function). In the case of a signal with no interference, the variability is equal to 1, as in the case of the signal of FIG. 1. In the case of severe interference, the variability can be equal to 100 or more, as in the case of the signal S of FIG. 2.

Figure 3:
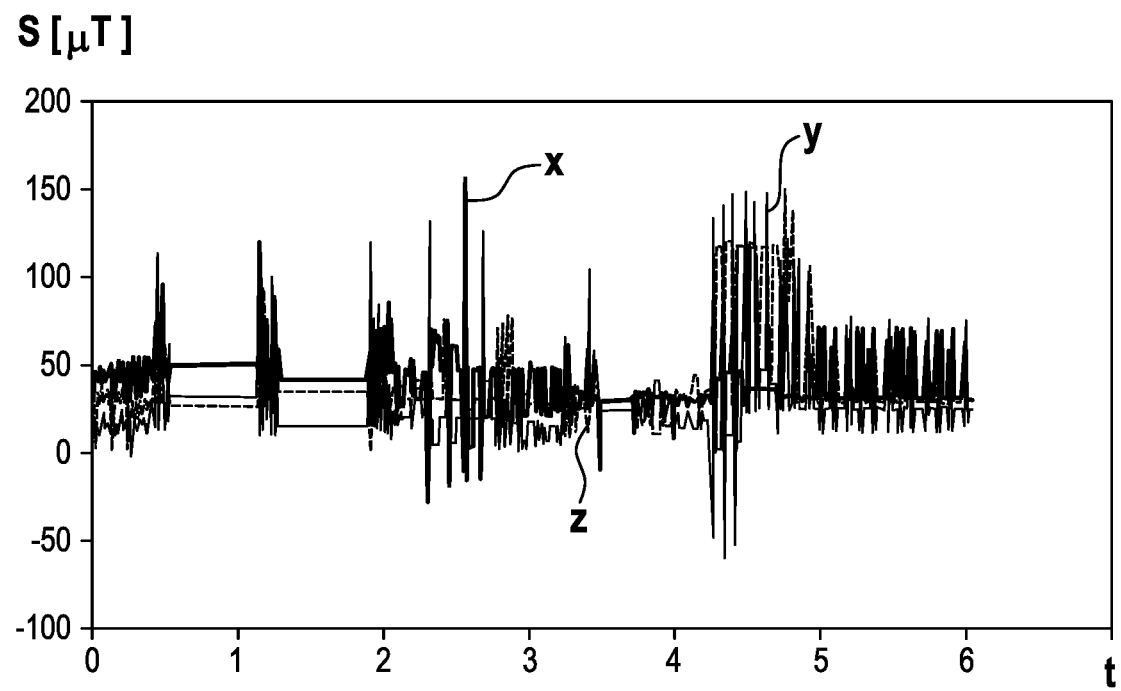
FIG. 3 shows signals of a real magnetic parking sensor in three Cartesian coordinates, in accordance with an example embodiment of the present invention.

FIG. 3 shows the signal S of a real magnetic parking sensor in three coordinate directions x, y, z. The individual components in the x, y, and z directions are highly oscillating, which signifies overall a high variability V of the magnetic signal S.

In accordance with an example embodiment of the present invention, it is provided to evaluate in a specific manner the variability, known in all coordinates x, y, z, of the magnetic signal S.

Firstly, by way of a detection device 10 (not depicted), x and y components of the detected measured values of the geomagnetic signal are written into a first-in, first-out memory device 20 (e.g., a ring memory) whose size is a power of two. The power of two is, for instance, 128, preferably 256, even more preferably 512, or 1024. Thanks to the power of two, the capacity of the first-in, first-out memory device can easily be modified in terms of programming by modifying the exponent. The higher this value of first-in, first-out memory device 20, the more reliably the proposed method for recognizing an availability state of a parking space functions.

The size of first-in, first-out memory device 20 also depends on the computation capacity of the hardware used for the proposed magnetic parking sensor, which often (for system-related reasons) has few battery and computation resources and is provided in order to be used in the field over a long period of time. A computation unit of the proposed magnetic parking sensor is preferably a microcontroller or microprocessor that is known per se and is programmed in Assembler code.

Based on an offline analysis of a large number of (for example, several hundred) experiments at a geographic location having specific geomagnetic properties, a variability V of the detected measured value M is ascertained, and a complex number base b is selected into which the geomagnetic measured value M is mapped.

A field F having a defined number, e.g., 128 or 256 or 512 or 1024, or another power of two, of measured values M, the magnitude of which depends on the variability V of the geomagnetic signal S, is also defined. The number of elements of the field F=x+i*y represents the geomagnetic measured values, where x represents the real component (magnetic x value) and y represents the imaginary component (magnetic y value).

Based on the description by Katai and Szabo in Acta Math. Sci. Szeged, 1974, the field F is then represented in the form of a generalized number system (b, F).

Boundaries of the number system (b, F)=$\Sigma a_k b^k$ are embodied fractally according to the following formula:

$$2 \log(\lambda_n)/\log(n^2+1)$$

where
n=variability;
$\lambda_n$=positive root of the polynomial $\lambda^3-(2n-1)\lambda^2-(n-1)^2\lambda-(n^2+1)$.

In this context, a, b, and k are integers, so that $\Sigma a_k b^k$ represents the equation of the fractal boundary line of the generalized number system (b, F), as described in the aforesaid theory of Katai, I., Szabo, J.

A decision as to an availability state of the parking space is then made by ascertaining a positive root $\lambda_n$ of the polynomial $\lambda^3-(2n-1)\lambda^2-(n-1)^2\lambda-(n^2+1)$, such that $2\times\log(\lambda_n)/\log(n^2+1)>a$ indicates an occupied state of the parking space, and $2\times\log(\lambda_n)/\log(n^2+1)<a$ indicates an unoccupied state of the parking space. The value a here represents a defined threshold value that can be equal, for instance, to 1. Suitable values of the threshold value a are preferably ascertained in the context of an offline analysis based on a large number of measurements. Positive integers can be represented in each complex number x+i*y by a corresponding amplitude |b|>1 using digits 0, 1, 2, . . . N−1.

In the example magnetic parking sensor for ascertaining an availability state of a parking space, the concept of the complex base is expanded to complex numbers, i.e., a complex number z=x+i*y, where x and y are real integers that are represented with the complex base b in the form z=$\Sigma a_k b^k$, where $a_k$ represents the digits of the representation.

The representation of the complex numbers of the complex base b=n+/−i can be visualized in the complex plane in the following manner, as depicted by way of example in FIG. 4:

The entire plane is divided into uniform quadrilaterals corresponding to the complex numbers; those quadrilaterals, which are mapped into the complex base b using the numbers 0, 1, 2, . . . , $n^2$, are then shaded. The complex base b is a "good base" if each complex number can be represented uniquely using the base b, i.e., each quadrilateral of the surface is correspondingly cross-hatched. A "good base" means in this connection that a monochrome (i.e., non-fractal) image with no spirals is present, and all the numbers are represented exactly. Advantageously, the proposed parking sensor can be realized in the embedded region, in which only a limited number of operators are available.

Figure 4:
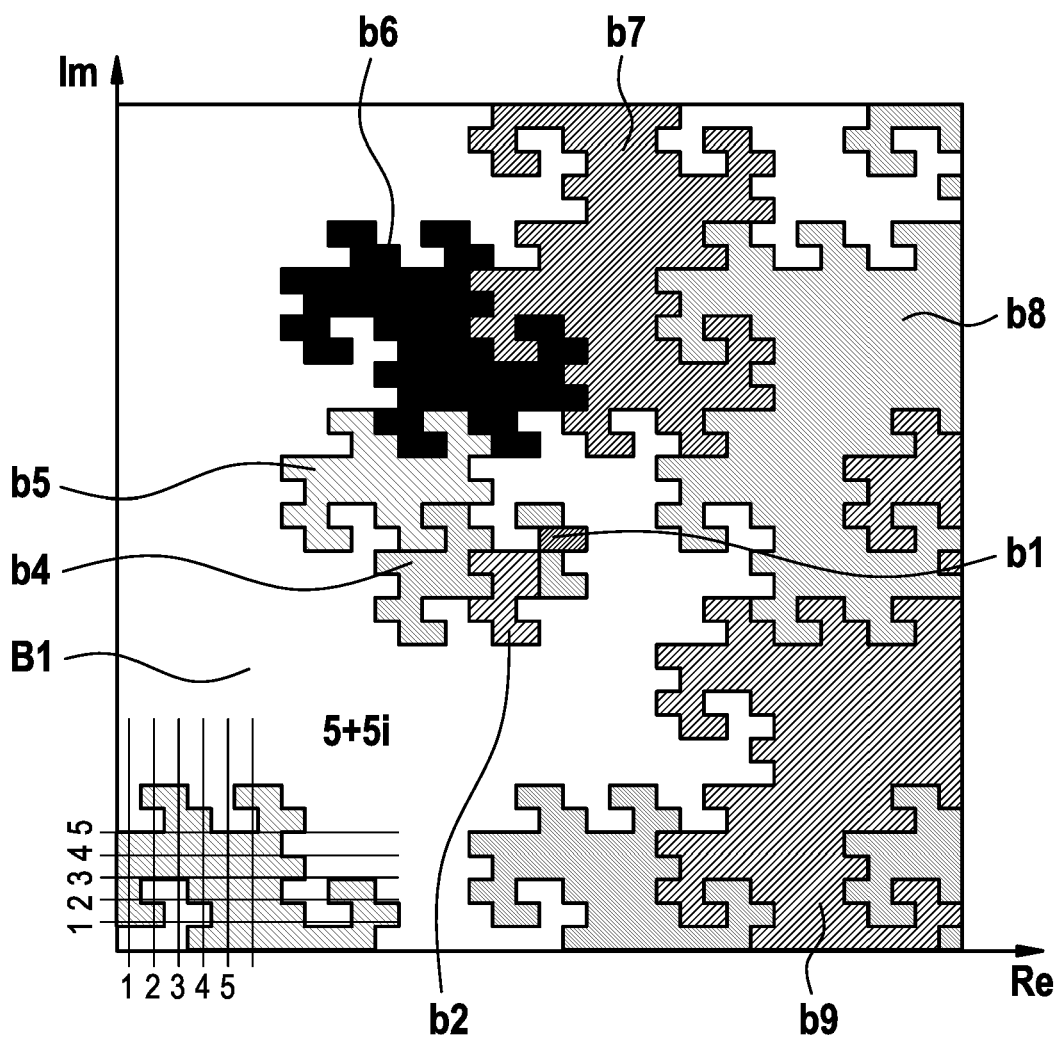
FIG. 4 schematically depicts a manner of operation of an example method for an occupied status of a parking space, in accordance with the present invention.

In FIG. 4, all the squares that correspond to numbers of a complex base b, preferably b=1−i using the numbers 0, 1, are shaded. Different shadings indicate the length of the extent.

It is evident from FIG. 4 that this "puzzle" never completely covers the entire surface, and that instead a spiral proceeds outward from regions b1 to b9.

A value of −1 therefore cannot be represented by the complex base b=1−i. A consequence is that negative magnetic measured values are not permissible, and they therefore cannot be represented by the proposed method. The result is that the proposed method is permissible only for positive geomagnetic measured values M.

The complex base 1+i similarly yields a spiral that depicts a map of the real axis of the Figure which is obtained from 1−i (not depicted). FIG. 4 thus shows, in principle, the manner of operation of the proposed method. It shows a light-colored non-shaded area B1, and an area of individual quadrilaterals b1 to b9 that represent the mapping of the geomagnetic signal S into the complex number base b. What is thereby achieved is that an availability status of the parking space can be inferred from an analysis of the boundary profile of light-colored region B1 with respect to the totality of shaded regions b1 to b9. In particular, a very jagged or fractal boundary region of region B1 with respect to the totality of the other regions b1 to b9 signifies an occupied state of the parking space.

It, thus, becomes apparent from FIG. 4 that in order to depict the geomagnetic measured value M with variability V, rather than a very large number or regions only a limited number of regions (in FIG. 4, nine regions: b1 to b9) are needed in order to largely cover region B1. Those nine regions are checked in the context of the number base b=1−i, with the result that real-time requirements in the microcontroller sector can be met in terms of easily implementing the proposed method. It has been found, in extensive offline analyses, that using nine regions, a wide range of the fractal surface can be substantially completely characterized using the "self-similar area" principle.

This takes into account the fact that the proposed method is implemented in a computer unit having limited computing performance and a limited energy supply, in which simple mathematical operations with a long utilization time must execute. What may be important in terms of recognizing an occupied state of the parking place from FIG. 4 is that the boundary region between region B1 and the totality of the other regions b1 to b9 is highly fractal or jagged.

The complex base b is selected so as to maximize the size of region B1. This is done on the basis of measurements in which the separation between the occupied state and unoccupied state of the parking space can be optimally realized.

Figure 5:
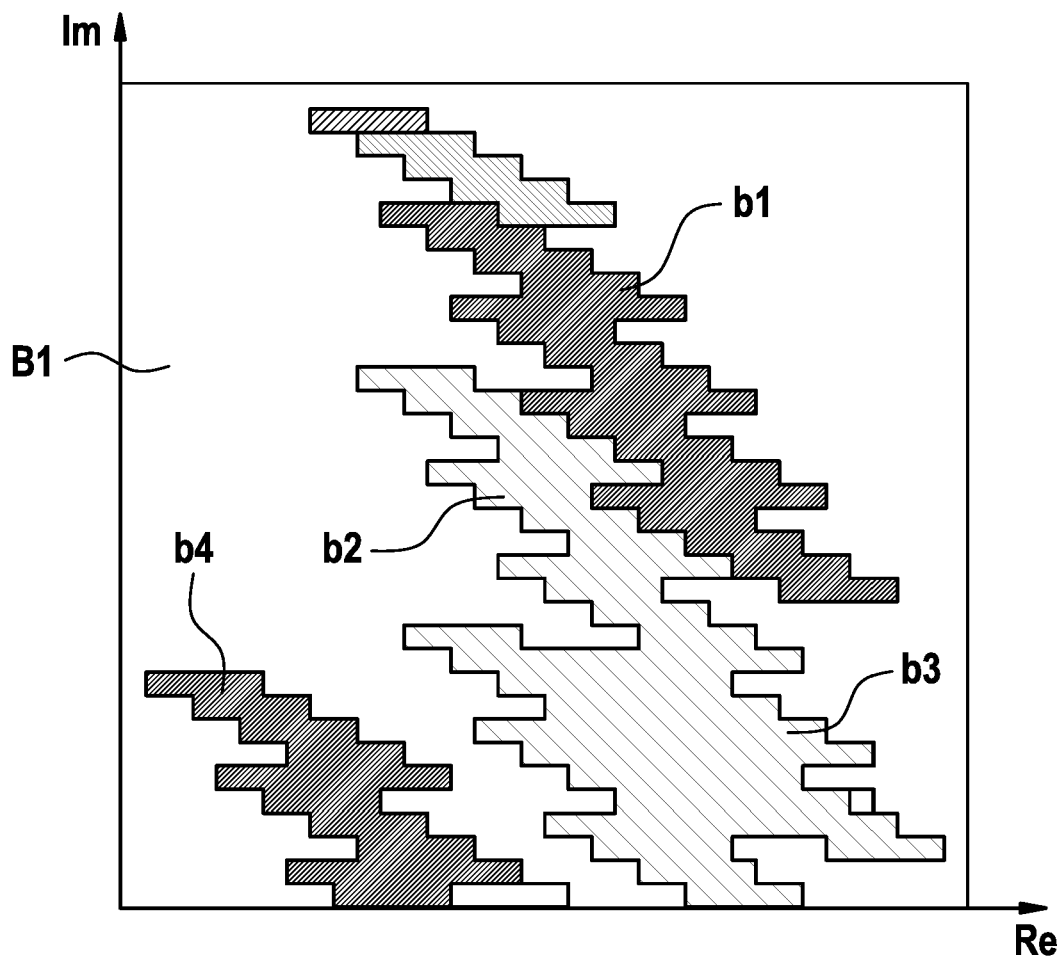
FIG. 5 schematically depicts a manner of operation of the example method for an unoccupied status of a parking space, in accordance with the present invention.

FIG. 5 shows an unoccupied state of the parking space, in which it is evident that the boundary profile of white region B1 with respect to the totality of the other regions b1 to b4 is now substantially smoother than in FIG. 4 and therefore indicates an unoccupied state of the parking space; in this case as well, all nine regions b1 to b9 are analyzed.

The result is thus that by way of magnetic parking sensor 100 it is possible in simple fashion to determine, by ascertaining an embodiment of a fractal boundary profile, whether the parking space is unoccupied or occupied.

In an advantageous embodiment of the present invention, provision can be made that several magnetic parking sensors 100 are networked with one another, thereby constituting a system that can guide users to unoccupied parking spaces.

Figure 6:
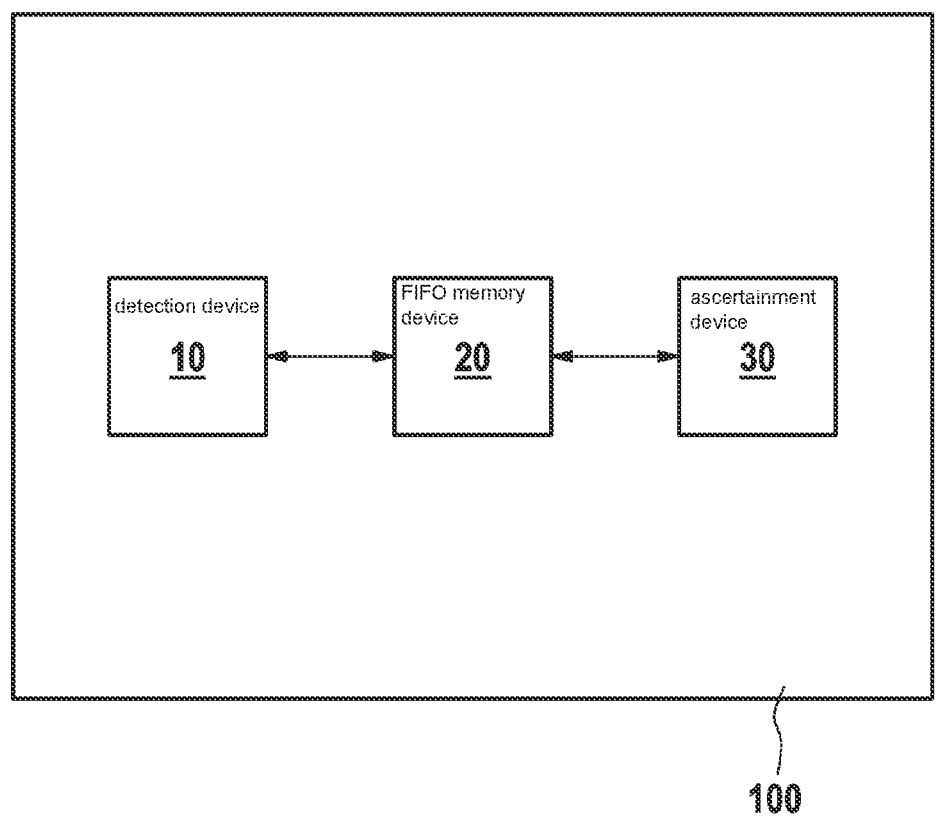
FIG. 6 is a schematic block diagram of an embodiment of a proposed magnetic parking sensor, in accordance with an example embodiment of the present invention.

FIG. 6 is a schematic block diagram of an embodiment of an example magnetic parking sensor 100.

It depicts a detection device 10 for detecting geomagnetic measured values M in the region of a parking space in three coordinates x, y, z.

Functionally connected to detection device 10 is a first-in, first-out memory device 20 into which x and y components of the geomagnetic measured values M are loadable, a magnetic variability V being ascertainable for a defined number of the magnetic measured values M in first-in, first-out memory device 20.

Functionally connected to first-in, first-out memory device 20 is an ascertainment device 30 that is configured
to map the geomagnetic measured values M (x+i*y) into a complex base number b, the complex base number b being ascertainable depending on the variability V of the geomagnetic measured values M; and to define a number system (b, F) having a defined number of elements n in accordance with the variability V of the geomagnetic measured values M and of the complex number b; and to ascertain an availability state of the parking space by ascertaining a root $\lambda_n$ of the polynomial $\lambda^3-(2n-1)\lambda^2-(n-1)^2\lambda-(n^2+1)$, such that $2 \times \log(\lambda_n)/\log(n^2+1) > a$ indicates an occupied state of the parking space, and $2 \times \log(\lambda_n)/\log(n^2+1) < a$ indicates an unoccupied state of the parking space.

Magnetic parking sensor 100 preferably ascertains the availability state of the parking space at defined time intervals, for instance every 10 seconds.

The example method is embodied as a computer program product that has program code means for executing the method on magnetic parking sensor 100, preferably in the form of a software program coded in Assembler, C, $C^{++}$, etc.

Figure 7:
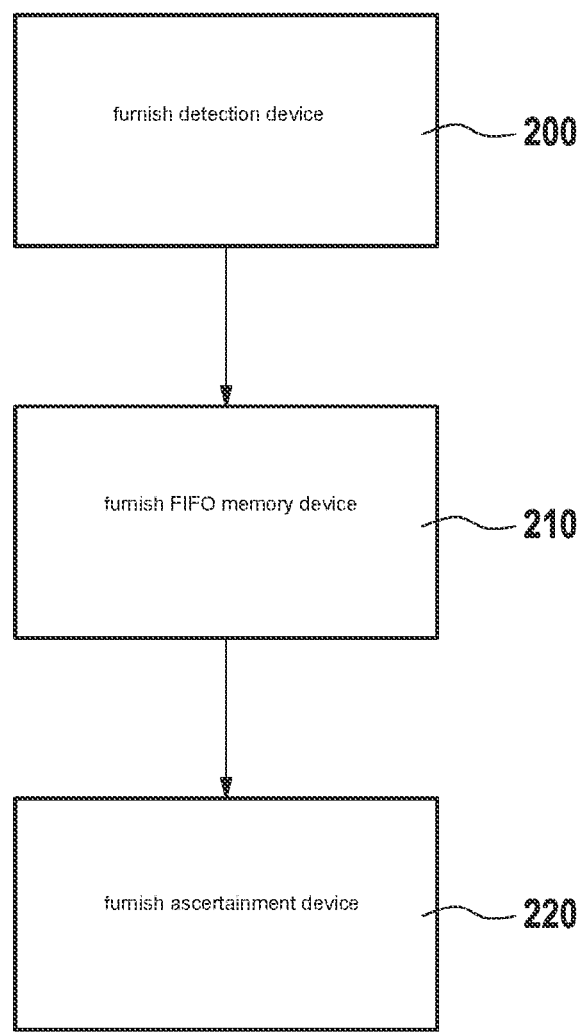
FIG. 7 schematically shows execution of a method for producing a proposed magnetic parking sensor, in accordance with an example embodiment of the present invention.

FIG. 7 shows execution of a method for producing an example magnetic parking sensor 100 in accordance with the present invention.

In a step 200, a detection device 10 for detecting geomagnetic measured values M in the region of a parking space in three coordinates x, y, z is furnished.

In a step 210, a first-in, first-out memory device 20, which is functionally connected to detection device 10 and into which the x and y components of the geomagnetic measured values M are loadable, is furnished, a magnetic variability being ascertainable for a defined number of the magnetic measured values M in first-in, first-out memory device 20.

In a step 220, an ascertainment device 30, functionally connected to first-in, first-out memory device 20, is furnished, said ascertainment device being configured
to map the geomagnetic measured values M into a complex base number b, the complex base number b being ascertainable depending on the variability V of the geomagnetic measured values M; and to define a number system (b, F) having a defined number of elements n in accordance with the variability V of the geomagnetic measured values M and of the complex base number; and
to ascertain an availability state of the parking space by ascertaining a root $\lambda_n$ of the polynomial $\lambda^3-(2n-1)\lambda^2-(n-1)^2\lambda-(n^2+1)$, such that $x \log(\lambda_n)/\log(n^2+1) > a$ indicates an occupied state of the parking space, and $2 \times \log(\lambda_n)/\log(n^2+1) < a$ indicates an unoccupied state of the parking space.

In summary, the present invention provides a magnetic parking sensor having a favorable so-called "separation base" (e.g., 1−i) that allows differences between an occupied state and an unoccupied state of a parking space to be clearly recognized. Advantageously, inexpensive MEMS sensors for internet-of-things applications can be used for the example parking sensor.

Although the present invention was described above on the basis of specific exemplifying embodiments, one skilled in the art can also, in view of the disclosure herein and without deviating from the essence of the present invention, implement embodiments that are not, or are only partly, disclosed above.

What is claimed is:

1. A magnetic parking sensor, comprising:
a detection device configured to detect geomagnetic measured values in a region of a parking space in three coordinates;
a first-in, first-out memory device into which the geomagnetic measured values are loadable, a magnetic variability being ascertainable for a defined number of the magnetic measured values in the first-in, first-out memory device; and
an ascertainment device configured to:
map x and y components of the geomagnetic measured values into complex numbers, the complex numbers being ascertainable depending on the variability of the defined number of the geomagnetic measured values;

define a number system having a defined number of elements in accordance with the variability of the geomagnetic measured values and of the complex numbers; and ascertain an availability state of the parking space by ascertaining a root $\lambda_n$ of a polynomial $\lambda^3-(2n-1)\lambda^2-(n-1)^2\lambda-(n^2+1)$ where n=variability of the geomagnetic measured values;

$\lambda$=auxiliary variable, such that $2\times\log(\lambda_n)/\log(n^2+1)>a$ indicates an occupied state of the parking space, and $2\times\log(\lambda_n)/\log(n^2+1)<a$ indicates an unoccupied state of the parking space, where a=defined threshold value.

2. The magnetic parking sensor as recited in claim 1, wherein the three-dimensional geomagnetic measured values are mapped into a defined complex number base b=1−i.

3. The magnetic parking sensor as recited in claim 1, wherein a calculation is executable using the ascertainment device at defined time intervals.

4. The magnetic parking sensor as recited in claim 1, wherein the first-in, first-out memory device is configured for a power of two of geomagnetic measured values.

5. The magnetic parking sensor as recited in claim 4, wherein the first-in, first-out memory device is configured for 128 or 256 or 512 or 1024 measured values.

6. A system, comprising:
a defined number of mutually networked magnetic parking sensors, each of the magnetic parking sensors including:
a detection device configured to detect geomagnetic measured values in a region of a parking space in three coordinates,
a first-in, first-out memory device into which the geomagnetic measured values are loadable, a magnetic variability being ascertainable for a defined number of the magnetic measured values in the first-in, first-out memory device, and
an ascertainment device configured to:
map x and y components of the geomagnetic measured values into complex numbers, the complex numbers being ascertainable depending on the variability of the defined number of the geomagnetic measured values,
define a number system having a defined number of elements in accordance with the variability of the geomagnetic measured values and of the complex numbers, and
ascertain an availability state of the parking space by ascertaining a root $\lambda_n$ of a polynomial $\lambda^3-(2n-1)\lambda^2-(n-1)^2\lambda-(n^2+1)$
where
n=variability of the geomagnetic measured values;
$\lambda$=auxiliary variable,
such that $2\times\log(\lambda_n)/\log(n^2+1)>a$ indicates an occupied state of the parking space, and $2\times\log(\lambda_n)/\log(n^2+1)<a$ indicates an unoccupied state of the parking space,
where
a=defined threshold value.

7. A method for producing a magnetic parking sensor, comprising the following steps:
furnishing a detection device configured to detect geomagnetic measured values in a region of a parking space in three coordinates;

furnishing a first-in, first-out memory device, functionally connected to the detection device, into which x and y components of the geomagnetic measured values are loadable, a magnetic variability of a defined number of the magnetic measured values in the first-in, first-out memory device being ascertainable; and furnishing an ascertainment device that is functionally connected to the first-in, first-out memory device and is configured to:
map the geomagnetic measured values into complex numbers, the complex numbers being ascertainable depending on the variability of the geomagnetic measured values,
define a number system having a defined number of elements in accordance with the variability of the geomagnetic measured values and of the complex numbers, and
ascertain an availability state of the parking space by ascertaining a root $\lambda_n$ of a polynomial $\lambda^3-(2n-1)\lambda^2-(n-1)^2\lambda-(n^2+1)$ such that $2\times\log(\lambda_n)/\log(n^2+1)>a$ indicates an occupied state of the parking space, and $2\times\log(\lambda_n)/\log(n^2+1)<a$ indicates an unoccupied state of the parking space,
where
n=variability of the geomagnetic measured values;
$\lambda$=auxiliary variable;
a=defined threshold value determined offline.

8. A method for ascertaining an availability state of a parking space, comprising the following steps:
three-dimensionally detecting geomagnetic measured values in a region of a parking space;
constituting x components and y components of the geomagnetic measured values;
loading the x and y components of the geomagnetic measured values into a first-in, first-out memory device;
ascertaining a magnetic variability for a defined number of the geomagnetic measured values in the first-in, first-out memory device;
mapping the geomagnetic measured values into a complex base number, the complex base number being ascertained depending on the variability of the geomagnetic measured values;
defining a number system having a defined number of elements in accordance with the variability of the geomagnetic measured value and of the complex base number; and
ascertaining an availability state of the parking space by ascertaining a root Xn of a polynomial $\lambda^3-(2n-1)\lambda^2-(n-1)^2\lambda-(n^2+1)$, such that $2\times\log(\lambda_n)/\log(n^2+1)>a$ indicates an occupied state of the parking space, and $2\times\log(\lambda_n)/\log(n^2+1)<a$ indicates an unoccupied state of the parking space,
where
n=variability of the geomagnetic measured values;
$\lambda$=auxiliary variable;
a=defined threshold value.

9. A non-transitory computer-readable data medium on which is stored a computer program product having program code for ascertaining an availability state of a parking space, the program code, when executed by a computer, causing the computer to perform the following steps:
three-dimensionally detecting geomagnetic measured values in a region of a parking space;
constituting x components and y components of the geomagnetic measured values;

loading the x and y components of the geomagnetic measured values into a first-in, first-out memory device;

ascertaining a magnetic variability for a defined number of the geomagnetic measured values in the first-in, first-out memory device;

mapping the geomagnetic measured values into a complex base number, the complex base number being ascertained depending on the variability of the geomagnetic measured values;

defining a number system having a defined number of elements in accordance with the variability of the geomagnetic measured value and of the complex base number; and ascertaining an availability state of the parking space by ascertaining a root Xn of a polynomial $\lambda^3-(2n-1)\lambda^2-(n-1)^2\lambda-(n^2+1)$, such that $2\times\log(\lambda_n)/\log(n^2+1)>a$ indicates an occupied state of the parking space, and $2\times\log(\lambda_n)/\log(n^2+1)<a$ indicates an unoccupied state of the parking space, where n=variability of the geomagnetic measured values;

$\lambda$=auxiliary variable;

a=defined threshold value.

\* \* \* \* \*